United States Patent
Li et al.

(10) Patent No.: US 9,982,876 B2
(45) Date of Patent: May 29, 2018

(54) ULTRATHIN LED LIGHT ENGINE

(71) Applicant: SICHUAN SUNFOR LIGHT CO., LTD., Chengdu, Sichuan (CN)

(72) Inventors: Gang Li, Sichuan (CN); Wentao Long, Sichuan (CN); Wei Zhao, Sichuan (CN); Chao Luo, Sichuan (CN); Chao Tang, Sichuan (CN); Dongming Li, Sichuan (CN)

(73) Assignee: SICHUAN SUNFOR LIGHT CO., LTD, Chengdu (CN)

( * ) Notice: Subject to any disclaimer, the term of this patent is extended or adjusted under 35 U.S.C. 154(b) by 155 days.

(21) Appl. No.: 14/893,869

(22) PCT Filed: Jun. 6, 2014

(86) PCT No.: PCT/CN2014/079381
§ 371 (c)(1),
(2) Date: Nov. 24, 2015

(87) PCT Pub. No.: WO2014/198200
PCT Pub. Date: Dec. 18, 2014

(65) Prior Publication Data
US 2016/0131350 A1    May 12, 2016

(30) Foreign Application Priority Data

Jun. 9, 2013  (CN) .................... 2013 2 0332617 U
Oct. 17, 2013 (CN) .................... 2013 1 0488314

(51) Int. Cl.
*H01L 33/48*   (2010.01)
*F21V 23/00*   (2015.01)
(Continued)

(52) U.S. Cl.
CPC .............. *F21V 23/005* (2013.01); *F21K 9/20* (2016.08); *F21V 29/70* (2015.01); *H01L 33/48* (2013.01);
(Continued)

(58) Field of Classification Search
None
See application file for complete search history.

(56) References Cited

U.S. PATENT DOCUMENTS 6,045,240 A *  4/2000  Hochstein ............ B60Q 1/2696
                                                  362/249.06
8,322,881 B1 * 12/2012  Wassel .................... F21V 7/00
                                                  362/217.05
(Continued)

FOREIGN PATENT DOCUMENTS

CN    101162075 A    4/2008
CN    201351893 Y   11/2009
(Continued)

OTHER PUBLICATIONS

International Search Report issued in PCT/CN2014/079381, dated Sep. 5, 2014.

*Primary Examiner* — Minh-Loan Tran
(74) *Attorney, Agent, or Firm* — Michael Ye; Morris, Manning & Martin, LLP

(57) ABSTRACT

An ultrathin LED light engine (100) comprises a protective cover (106), a driving circuit board (101), an aluminum substrate (103) and at least one LED module (104). A double-sided high-viscosity heat conducting plate (102) covers the first surface of the aluminum substrate (103) to fix the driving circuit board (101); the at least one LED module (104) is fixed on the first surface and insulated from the aluminum substrate (103) by means of an insulating layer (200) on the first surface; a conductive circuit for electrically connecting the at least one LED module (104) and the
(Continued)

driving circuit board (101) is arranged on the insulating layer (200); and the size of the aluminum substrate (103) at least at the local peripheral outer area is greater than that of the driving circuit board (101), so that the double-sided high-viscosity heat conducting plate (102) on the first surface at least locally fixes the protective cover (106). The LED light engine (100) realizes ultrathin design and built-in integration of drive and control devices, and realizes heat conduction and fixation of the PCB and the protective cover by using a double-sided high-viscosity film.

17 Claims, 7 Drawing Sheets

(51) Int. Cl.

| | | |
|---|---|---|
| H01L 33/62 | (2010.01) | |
| H01L 33/64 | (2010.01) | |
| H05K 1/02 | (2006.01) | |
| F21V 29/70 | (2015.01) | |
| H05K 1/05 | (2006.01) | |
| H05K 1/11 | (2006.01) | |
| F21K 9/20 | (2016.01) | |
| F21Y 107/10 | (2016.01) | |
| F21Y 111/00 | (2016.01) | |
| F21V 7/04 | (2006.01) | |
| H05K 3/00 | (2006.01) | |
| F21Y 115/10 | (2016.01) | |

(52) U.S. Cl.
CPC .......... *H01L 33/483* (2013.01); *H01L 33/486* (2013.01); *H01L 33/62* (2013.01); *H01L 33/64* (2013.01); *H05K 1/021* (2013.01); *H05K 1/05* (2013.01); *H05K 1/115* (2013.01); *F21V 7/04* (2013.01); *F21Y 2107/10* (2016.08); *F21Y 2111/00* (2013.01); *F21Y 2115/10* (2016.08); *H05K 3/0061* (2013.01); *H05K 2201/10106* (2013.01); *Y10S 362/80* (2013.01)

(56) References Cited

U.S. PATENT DOCUMENTS

| | | | |
|---|---|---|---|
| 2010/0188848 A1 | 7/2010 | Liaw | |
| 2010/0237375 A1* | 9/2010 | Yamazaki | H01L 33/507 |
| | | | 257/98 |
| 2010/0264439 A1* | 10/2010 | Chen | H01L 33/483 |
| | | | 257/98 |

FOREIGN PATENT DOCUMENTS

| | | |
|---|---|---|
| CN | 101595573 A | 12/2009 |
| CN | 102384438 A | 3/2012 |
| WO | 2013/022283 A2 | 2/2013 |

\* cited by examiner

100

100

ULTRATHIN LED LIGHT ENGINE

TECHNICAL FIELD

The present disclosure relates to an integrated LED lighting device in the field of LED lighting, and more particularly, to an ultrathin LED light engine.

BACKGROUND

An LED light Engine is an integrated light source containing an LED packaged element or an LED array (module), an LED driver and other photometric, thermal, mechanical and electrical components. The integrated light source may be directly connected to a branch circuit through a conventional connector which matches with an LED lamp. Accordingly, an LED light Engine is a device interposed between an LED lamp and an LED light source. An LED light Engine differs from an LED light source in that the LED light source cannot be directly connected to a branch circuit unless it is provided with a standard lamp holder. An LED light Engine is similar to an LED lamp in that they both have designed light distribution and heat radiating capabilities. The product of the LED light Engine can effectively enhance stability of an indoor LED lamp and improve performances such as color rendering, lighting system's efficiency or the like. Therefore, the LED light Engine has become a focus of future development and promotion for LED lighting manufactures.

Currently, LED light Engines have been used in development and design of lamps. It can simplify development of the lamps and shorten development time of the same, reduce assembling time of lamps and improve reliability of lighting systems. However, a conventional light engine (e.g. see CN200780042271.1) generally has a relatively high height and heavy weight due to thermal and aesthetic requirements, which is not easy for assembling. In addition, CN201010157844.9 discloses a design scheme with separate bodies. Although it is described that the scheme can achieve an ultrathin product, and can solve, to a certain degree, the problem of replacement of the LED module, it is far from achieving an ultrathin product. Since it carries therein with a driving circuit, an LED module, and especially a heat dissipation mechanism, the light Engine has a relatively heavy weight, and a mechanical mounting mechanism such as screws are generally provided for the conventional light engine for securing the components of the LED light engine. However, the screws have certain heights which inevitably increase overall size of the entire mechanism. Accordingly, a side screw mounting mechanism has to be provided to achieve ultrathin objective, such as in the technical solution disclosed by CN201220329399.4. The increased side structure is purely for securing, and compromises the purpose of downsizing.

SUMMARY

In view of the above deficiencies in the prior art, the present disclosure provides an ultrathin LED light engine, comprising a protective cover, a driving circuit board, an aluminum substrate and at least one LED module, characterized in that, a double-sided high-viscosity heat conducting plate covers a first surface of the aluminum substrate to secure the driving circuit board; the at least one LED module is secured on the first surface and insulated from the aluminum substrate by means of an insulating layer on the first surface; a conductive circuit is disposed on the insulating layer for electrically connecting the at least one LED module and the driving circuit board; and at least an outer peripheral area of the aluminum substrate is larger than an outer peripheral area of the driving circuit board, so that the double-sided high-viscosity heat conducting plate on the first surface secures the protective cover at least at a partial area.

According to a preferred embodiment, an outer peripheral area of the aluminum substrate which is covered by the double-sided high-viscosity heat conducting plate goes beyond an outer perimeter of the driving circuit board, and a lower edge of the protective cover is secured on the double-sided high-viscosity heat conducting plate at the outer peripheral area of the aluminum substrate which goes beyond the outer perimeter of the driving circuit board.

According to a preferred embodiment, the driving circuit board has a shape of a plate with a central opening, the at least one LED module is positioned at the central opening of the driving circuit board, and a power supply interface of the at least one LED module is located within the protective cover.

According to a preferred embodiment, the protective cover has a shape of a circular ring, an elliptical ring or a rectangular ring in a plan view, and the protective cover has a height adapted for accommodating the driving circuit board.

According to a preferred embodiment, the protective cover has an internal hole, an outer wall and a light reflecting inclined surface extending from the internal hole to an outer perimeter of the protective cover, wherein a size of the internal hole matches a size of one of the at least one LED module, a lower edge of the internal hole is secured on the double-sided high-viscosity heat conducting plate at a position adjacent to the at least one LED module, and wherein the lower edge of the outer wall is secured on the double-sided high-viscosity heat conducting plate at the outer peripheral area of the aluminum substrate which goes beyond the outer perimeter of the driving circuit board.

According to a preferred embodiment, the conductive circuit is a printed circuit, the conductive circuit has a power supply port for obtaining power from an external power source, and the conductive circuit has an LED power supply interface for supplying power to the at least one LED module.

According to a preferred embodiment, the aluminum substrate and the protective cover have circular, elliptical or rectangular shapes corresponding to each other.

According to a preferred embodiment, the protective cover is provided with a fastener portion for securing an optical element.

According to a preferred embodiment, a bump-shaped pad is disposed on the conductive circuit on the aluminum substrate, a through-hole-shaped pad corresponding to the bump-shaped pad is disposed on the driving circuit board, and the bump-shaped pad and the through-hole-shaped pad are electrically connected by welding.

According to a preferred embodiment, at least two mounting holes extending through the protective cover, the driving circuit board and the aluminum substrate are disposed on the LED light engine, so as to secure the LED light engine on a lighting device by means of an external mounting mechanism.

According to a preferred embodiment, a slope gradient of the light reflecting inclined surface of the protective cover depends on a height of the protective cover which is at least capable of accommodating the driving circuit board.

According to a preferred embodiment, the fastener portion of the protective cover is a detachable ring-shaped buckle, wherein at least two grooves are evenly distributed on a surface of the fastener portion of the protective cover, and match with at least two corresponding flanges on the optical element to form fasteners.

According to a preferred embodiment, the at least two mounting holes on the LED light engine are evenly distributed in the outer peripheral area of the LED light engine, wherein the at least two mounting holes are through holes extending through the protective cover, the driving circuit board and the aluminum substrate, and wherein internal surfaces of the through holes are distributed with B-type threads with triangular teeth.

According to a preferred embodiment, a lower edge of the protective cover overlaps with a side of the aluminum substrate.

According to a preferred embodiment, the LED light engine is rectangular in a plan view, a first lower edge, a second lower edge and a third lower edge of the protective cover respectively overlap with a first side, a second side and a third side of the aluminum substrate.

According to a preferred embodiment, a first lower edge and a second lower edge of the protective cover respectively overlap with a first side and a second side of the aluminum substrate.

According to a preferred embodiment, a first lower edge of the protective cover overlaps with a first side of the aluminum substrate.

According to a preferred embodiment, a size of the aluminum substrate is 1% larger than an area occupied by the protective cover.

According to a preferred embodiment, a through hole made of conductive material, a mechanical mounting hole and an electrical connection hole are disposed in the driving circuit board, wherein the mechanical mounting hole and the electrical connection hole are evenly distributed on the driving circuit board.

According to a preferred embodiment, the aluminum substrate has an electrical connection through hole corresponding to the electrical connection hole of the driving circuit board, wherein a wire of the driving circuit board passes through the electrical connection through hole to be connected to an external power source to obtain power therefrom.

According to a preferred embodiment, a double-sided high-viscosity heat conducting plate is covered on a bottom of the aluminum substrate, and the LED light engine is directly secured to another lighting device through the double-sided high-viscosity heat conducting plate.

According to a preferred embodiment, the light reflecting inclined surface is an inclined surface with an orange-peel effect.

According to a preferred embodiment, a lower edge of the internal hole has a trapezoidal cross section, wherein convex dots are evenly distributed on a lower surface of the lower edge, so that the lower surface are tightly adhered to the double-sided high-viscosity heat conducting plate.

According to a preferred embodiment, a downward-opened U-shaped hook element which projects upward is disposed at an outer perimeter of the aluminum substrate; an upward-opened U-shaped hook element matching the downward-opened U-shaped hook element is disposed at a lower end of the outer wall of the protective cover, so that the downward-opened U-shaped hook element and the upward-opened U-shaped hook element are connected to each other in an embedded manner.

According to a preferred embodiment, the first surface is provided with evenly distributed convex dots, so that the double-sided high-viscosity heat conducting plate tightly covers the aluminum plate.

According to a preferred embodiment, the double-sided high-viscosity heat conducting plate is made of elastic material having a thickness of 0.1-0.5 mm.

According to a preferred embodiment, a fracture-reserved slot is disposed at a portion of the aluminum substrate which goes beyond an area of the protective cover; and the fracture-reserved slot is V-shaped.

The present disclosure achieves at least the following advantages:

1. it can achieve both of ultrathin design and integration of built-in driving and controlling means;

2. the double-sided high-viscosity plate can function both for dissipating heat and securing the PCB and the protective cover;

3. the PCB and the aluminum substrate can be connected both mechanically and electrically by welding corresponding pads;

4. a side of the LED is designed with an inclined surface, thereby the light emitting angle can be adjusted by selecting a proper protective cover as desired;

5. the present invention can be implemented in profiles of various shapes;

6. the protective cover is made of light-weighted material which is excellent for heat dissipation and the light reflecting inclined surface of the protective cover has a larger area than an area of a vertical surface with the same height, thereby the heat dissipation area can be enlarged, and heat dissipation efficiency is further improved; and 7. the fastener portion is a detachable ring-shaped buckle, thereby it can be disassembled and reassembled repeatedly, which is easy, convenient and fast.

The LED light engine according to the present disclosure is designed for an ultrathin application with built-in driving and controlling means, and can be applied in widespread fields of spotlights, down-lights and the like. The prevent invention has a reduced size and thickness, is a miniaturized product with a light weight, a small size, and a high cost performance, without requirement for an external driving circuit. In particular, the LED light engine according to the present disclosure can achieve a product having an overall thickness less than 6 mm.

MANIFEST

100—LED light engine
106—protective cover
101—driving circuit board
103—aluminum substrate
104—LED module
102—double-sided high-viscosity heat conducting plate
105—light reflecting inclined surface
107—conductive circuit
108—first surface
109—fastener portion
110—optical element
111—groove
112—flange
200—insulating layer
201—through-hole-shaped pad
202—bump-shaped pad

DETAILED DESCRIPTION

Hereinafter, the present disclosure will be described in detail with reference to the accompanying drawings.

Figure 1:
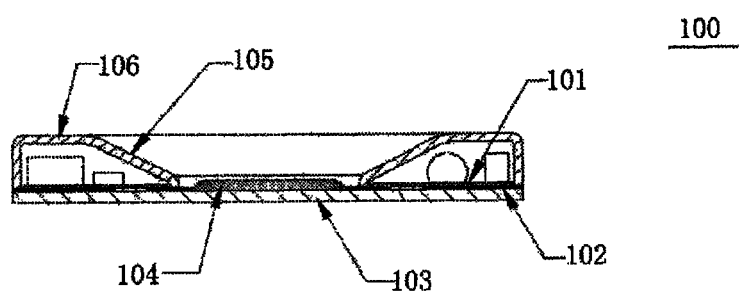
FIG. 1 is a cross sectional view of an ultrathin LED light engine according to the present disclosure.

FIG. 1 shows an ultrathin LED light engine 100, including a protective cover 106, a driving circuit board 101, an aluminum substrate 103 and at least one LED module 104. As shown in the drawing, an upward surface of the ultrathin LED light engine 100 is an out-light surface, and a bottom surface thereof is the aluminum substrate. The protective cover 106 covers the driving circuit board 101 to protect the driving circuit board 101 from being damaged by external forces, and to protect it from influence of moisture. The aluminum substrate 103 and the at least one LED module 104 are adhered to each other by means of a double-sided high-viscosity heat conducting plate 102.

A first surface of the aluminum substrate 103 is covered by the double-sided high-viscosity heat conducting plate 102, and the driving circuit board 101 is secured by means of the double-sided high-viscosity heat conducting plate 102. The double-sided high-viscosity heat conducting plate is a thermal conductive silicon film, a flame retardant silicone film, or a thermal-conductive insulation film with high performance. The thermal conductive silicon film is high-performance gap-filled thermal conductive material, which is generally used as a transferring interface between an electronic device and a heat radiation sheet or a casing of the product. Such a thermal conductive silicon film is also filled with glass fibers (or carbon fibers) to enhance its mechanical strength. Some thermal conductive silicon films are coated with thermal-resistant and pressure-sensitive adhesive. The flame retardant silicone film has performances of thermal conduction, insulation and anti-vibration, with a soft and self-adhesive material, so it is easy to operate, and may serve as heat conductive filler between surfaces of various irregular parts and radiators, casings, or the like. The thermal-conductive insulation film is high-performance elastic insulation material with a special film as base material. It has an excellent cut resistance and excellent thermal conductive performance, widely used in electrical and electronic industries. The double-sided high-viscosity heat conducting plate 102 has an excellent adhesiveness, flexibility, compression performance and heat conductive rate. In operation, a double-sided high-viscosity heat conducting plate can make an electronic element and a heat dissipation plate in tight contact with each other, and can achieve a desirable heat dissipating effect. Moreover, the double-sided high-viscosity heat conducting plate of a selected thickness can be cut according to a size of heat generating area and a height of a gap. In addition, the double-sided high-viscosity heat conducting plate 102 does not tend to be peeled off, and is easy for operation. It can dissipate heat and can also, in place of screws, secure other members such as the protective cover in the light engine, thereby significantly reduce the size of the product. Physical properties of the double-sided high-viscosity heat conducting plate 102 used in the present disclosure may be referred to the following table:

TABLE 1

| Testing Items | Testing Methods | Units | HC240 Testing Values |
| --- | --- | --- | --- |
| Color | Visual | | Grey/Black |
| Thickness | ASTM D374 | mm | 0.5~10.0 |
| Specific Gravity | ASTM D792 | g/cc | 1.8 ± 0.1 |
| Hardness | ASTM D2240 | Shore C | 18 ± 5~40 ± 5 |
| Tensile Strength | ASTM D412 | Kg/cm$^2$ | 8 |
| | ASTM D412 | Pa | 5.88 * 10$^9$ |
| Continuous temperature resistance | EN344 | °C. | −40~+220 |
| Volume Resistivity | ASTM D257 | Ω · CM | 1.0 * 10$^{11}$ |
| Breakdown Voltage | ASTM D149 | kv/mm | 4 |
| Flame Rating | UL-94 | | V-0 |
| Conductivity | ASTM D5470 | w/ (m · k) | 2.4 |

At least one LED module 104 is secured on the first surface, and is insulated from the aluminum substrate 103 by means of an insulating layer 200 on the first surface 108. A conductive circuit 107 is disposed on the insulating layer 200 for electrically connecting the at least one LED module 104 and the driving circuit board 101. The conductive circuit has an LED power supply interface for supplying power to the at least one LED module 104. At least an outer peripheral area of the aluminum substrate 103 is larger than an outer peripheral area of the driving circuit board 101, so that the double-sided high-viscosity heat conducting plate 102 on the first surface secures the protective cover 106 at least in a partial area. By securing the protective cover 106 through the double-sided high-viscosity heat conducting plate 102, space is saved due to elimination of screws and bolts.

According to a preferred embodiment, an outer peripheral area of the aluminum substrate 103 which is covered by the double-sided high-viscosity heat conducting plate 102 goes beyond an outer perimeter of the driving circuit board 101, and a lower edge of the protective cover 106 is secured on the double-sided high-viscosity heat conducting plate 102 at the outer peripheral area of the aluminum substrate 103 which goes beyond the outer perimeter of the driving circuit board 101.

According to a preferred embodiment, the driving circuit board 101 has a shape of a plate with a central opening, the at least one LED module 104 is positioned at the central opening of the driving circuit board 101, and a power supply interface of the at least one LED module 104 is located within the protective cover 106.

According to a preferred embodiment, the protective cover 106 has a shape of a circular ring, an elliptical ring or a rectangular ring in a plan view, and the protective cover 106 has a height adapted for accommodating the driving circuit board 101. Since the driving circuit board 101 has a relatively small height, a small overall height of the entire structure can be achieved. The protective cover 106 is made of light-weighted material with excellent heat conductive performance. Accordingly, by means of the double-sided high-viscosity heat conducting plate 102, the aluminum substrate 103 and the protective cover 106 together form a heat dissipation structure which fully utilizes various casing parts of the light engine to achieve both of an ultrathin size and heat dissipation.

According to a preferred embodiment, the protective cover 106 has an internal hole, an outer wall and a light reflecting inclined surface 105 extending from the internal hole to an outer perimeter of the protective cover 106, wherein a size of the internal hole matches a size of at least one LED module 104, a lower edge of the internal hole is secured on the double-sided high-viscosity heat conducting plate 102 at a position adjacent to the at least one LED module 104, and wherein the lower edge of the outer wall is secured on the double-sided high-viscosity heat conducting plate 102 at the outer peripheral area of the aluminum substrate 103 which goes beyond the outer perimeter of the driving circuit board 101. In other words, the protective cover 106 is secured to the aluminum substrate 103 only at the lower edge of the internal hole and the lower edge of the outer wall. The securing is achieved by means of the double-sided high-viscosity heat conducting plate 102, which fully utilizes the casing parts to dissipate heat.

According to a preferred embodiment which is not shown in the drawings, the conductive circuit is a printed circuit, the conductive circuit has a power supply port for obtaining power from an external power source, and the conductive circuit has an LED power supply interface for supplying power to the at least one LED module 104. The advantage of a printed circuit lies in that it can eliminate the requirement to weld on the circuit board repeatedly and many complex manual wiring, and it can achieve a high accuracy and improve the productivity of circuit boards. During manufacture, the conductive patterns are formed on the insulating layer 200 of the aluminum substrate 103 by etching or photosensitive printing. Thereby, the manufacture is made simple and easy, and the produced electronic devices have consistent performances, stable qualities and compact structures. The conductive circuit obtains power from an external power source through the power supply port, and then supplies the power to the at least one LED module through the LED power supply interface of the at least one LED module 104, so as to achieve an electrical connection.

According to a preferred embodiment, the aluminum substrate 103 and the protective cover 106 have circular (see FIG. 3), elliptical or rectangular (see FIG. 4) shapes corresponding to each other. As shown in FIG. 5, the aluminum substrate 103 and the protective cover 106 also have a square shape. The aluminum substrate 103 and the protective cover 106 have shapes corresponding to each other, to facilitate achieving of an overall structure of the light engine and mounting the light engine 100 to other lighting mechanism later.

According to a preferred embodiment, the protective cover 106 is provided with a fastener portion for securing an optical element. An optical element can be provided in the light emitting area over the internal hole of the protective cover 106, to achieve various optical effects. This will not change the overall height of the product.

Figure 2:
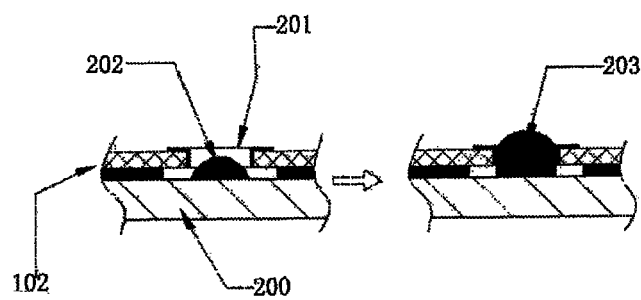
FIG. 2 is a detailed view of an ultrathin LED light engine according to the present disclosure.

Referring to FIG. 2, a bump-shaped pad 202 is disposed on the conductive circuit on the aluminum substrate 103, a through-hole-shaped pad 201 corresponding to the bump-shaped pad 202 is disposed on the driving circuit board 101, and the bump-shaped pad 202 on the aluminum substrate 103 and the corresponding through-hole-shaped pad 201 on the driving circuit board 101 can be connected by a welding wire, so that the aluminum substrate 103 and the driving circuit board 101 can be secured together and also form an electrical connection.

According to a preferred embodiment, at least two mounting holes extending through the protective cover 106, the driving circuit board 101 and the aluminum substrate 103 are disposed on the LED light engine 100, so as to secure the LED light engine 100 on a lighting device by means of an external mounting mechanism.

According to a preferred embodiment, a slope gradient of the light reflecting inclined surface 105 of the protective cover 106 depends on a height of the protective cover 106 which is at least capable of accommodating the driving circuit board 101. Since the driving circuit board is provided with electrical elements (such as a capacitor) which occupy a certain three-dimensional space, it requires the protective cover 106 to have a certain three-dimensional structure. In this regard, the present disclosure provides an optimized structural design, in which the protective cover 106 can have both of a protection function and a light reflecting function.

According to a preferred embodiment, a reflective film made of mirror-surface aluminum, sandblasted aluminum, a plastic surface, a white paint layer or diffusion nanometer coating with a high reflective rate is provided on the light reflecting inclined surfaces of the protective cover 106. This technical feature further enhances the light emitting effect. With material of various reflective rates and reflective effects, the light engine can have various light emitting effects. In addition, a significant difficulty of a LED light lies in that the light utilization rate is low and it will produce glaring light. Accordingly, in manufacture, a LED lamp will be provided with reflective coating or a reflector which can avoid LED glaring light, so that light will form a secondary surface light source via the reflective surface, solving the problem of LED glaring light as well as improving light utilization. For example, in the ultrathin LED light engine of the present disclosure, the protective cover around the light output surface has a smooth reflective inclined surface coated with reflective paint to produce a star light effect. Such an LED light engine can produce a star light effect in a low-level light circumstance, as a decorative effect. As another example, the protective cover 106 is positioned around a COB encapsulation and the LED light emitting portion, and a mounting base is provided on the light reflecting inclined surface 105, for the user to mount various optical reflectors depending on specific application. This satisfies various personalization requirements.

According to a preferred embodiment, the fastener portion 109 of the protective cover 106 is a detachable ring-shaped buckle, wherein at least two hook-shaped grooves 111 are evenly distributed on a surface of the fastener portion 109 of the protective cover 106, to match at least two corresponding flanges 112 on the optical element 110 to form a buckle. A flange is constituted of a beam and a holding element. The fastener (buckle) is a mechanism for one part imbedded into or wholly locked into another part, typically for connection of plastic members and made of flexible plastic material. The protective cover 106 is made of light-weighted heat conductive composite material with a certain ability of elastic deformation and easy to be mounted and detached even without a tool. In addition to that the fastener portion of the protective cover 106 can connect the LED light engine 100 with another lighting device, the detachable ring-shaped buckle of the present disclosure facilitates replacement of the LED light engine or the lighting device. It is easy to operate and does not cause waste of resources since one damaged member will not render the whole LED lighting device useless.

According to a preferred embodiment not shown in the drawings, the at least two mounting holes on the LED light engine 100 are evenly distributed in the outer peripheral area of the LED light engine 100. For example, for a circular or elliptical LED light engine, the mounting holes are distributed at an even interval in the outer peripheral area of the LED light engine 100. As another example, for an LED light engine 100 of a rectangular shape, the mounting holes on each side are distributed at an even interval, wherein at least two mounting holes are disposed on the diagonal of the LED light engine 100 to enhance the securing. The at least two mounting holes are through holes extending through the protective cover 106, the driving circuit board 101 and the aluminum substrate 103, so that the securing screw can pass through the protective cover 106, the driving circuit board 101 and the aluminum substrate 103. The length of the screw is larger than the thickness of the LED light engine, and a part of the screw protruding from the LED light engine exactly matches a mounting portion such as a mounting hole on a lamp. Internal surfaces of the through holes are distributed with B-type threads with triangular teeth. The B-type threads are single line with triangle teeth, the teeth art large and the threads have good self-locking performance. Moreover, the teeth have thick roots and high strength and the threads are fast to lock and can be repeatedly used, which is suitable for plastic material and will not cause the plastic material burned, break or damage the locking portion.

Figure 3:
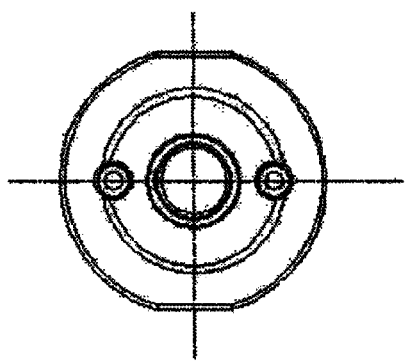
FIG. 3 is a top view of an ultrathin LED light engine according to an embodiment of the present disclosure.
Figure 4:
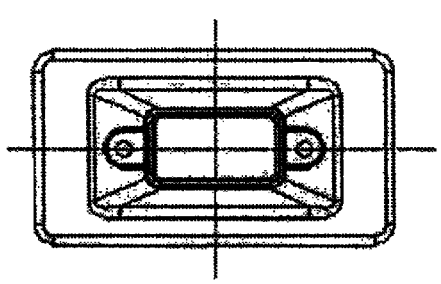
FIG. 4 is a top view of an ultrathin LED light engine according to an embodiment of the present disclosure.
Figure 5:
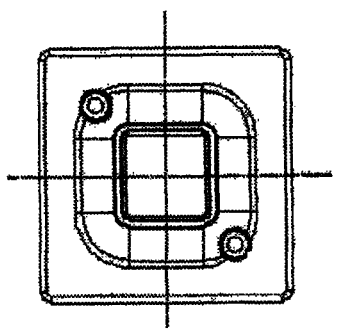
FIG. 5 is a top view of an ultrathin LED light engine according to an embodiment of the present disclosure.
Figure 6A:
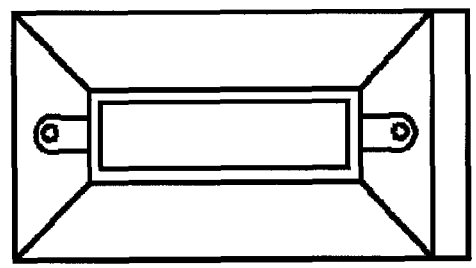
FIG. 6(a) is a top view of an ultrathin LED light engine according to an embodiment of the present disclosure.
Figure 6B:
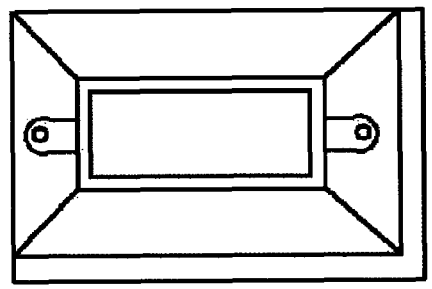
FIG. 6(b) is a top view of an ultrathin LED light engine according to an embodiment of the present disclosure.
Figure 6C:
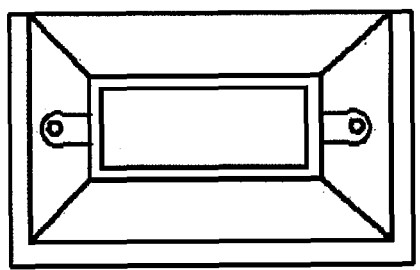
FIG. 6(c) is a top view of an ultrathin LED light engine according to an embodiment of the present disclosure.

Referring to FIGS. 3, 4 and 5, a lower edge of the protective cover 106 overlaps with a side of the aluminum substrate 103. Thus, the LED light engine can have a minimum volume. In addition, when the LED light engine is of a rectangular shape, the protective cover 106 and the aluminum substrate 103 can be positioned relative to each other in the following manners: a first lower edge, a second lower edge and a third lower edge of the protective cover 106 respectively overlap with a first side, a second side and a third side of the aluminum substrate 103, as shown in FIG. 6(*c*); a first lower edge and a second lower edge of the protective cover 106 respectively overlap with a first side and a second side of the aluminum substrate 103, as shown in FIG. 6(*b*); and a first lower edge of the protective cover 106 overlaps with a first side of the aluminum substrate 103, as shown in FIG. 6(*a*). The manners can be selected depending on specific application of the LED light engine. Referring to FIGS. 6(*a*), 6(*b*) and 6(*c*), a size of the aluminum substrate 103 is larger by 1% than an area occupied by the protective cover 106.

According to a preferred embodiment not shown in the drawings, the LED module 104 is a LED module with a COB encapsulation, wherein a chip of the LED module is directly encapsulated on the printed circuit. The COB encapsulation directly encapsulates a plurality of LED chips on a metal substrate (such as the aluminum substrate) printed circuit board MCPCB which will directly dissipate heat through the aluminum substrate 103. This can not only simplify the manufacture process and reduce its cost, but also can reduce heat resistance in heat dissipation. In the LED module with a COB encapsulation, a plurality of LED chips is mounted on the substrate, thereby the brightness can be enhanced by the plurality of LED chips, and the LED chips can be reasonably disposed to reduce input current of each single LED chip and ensure a high efficiency. Moreover, such a surface light source can significantly enlarge the heat dissipating area of the encapsulation, so that heat can be more easily transferred to the protective cover 106, and discharged outside through the protective cover 106 which is made of light-weighted heat conductive composite material. In addition, through the rational design and molding micro-lenses, the spot lights, glaring lights and other defects existing in the combined device of discrete light sources can be avoided. In addition, if combination of red chips is provided, color performance of the light source can be effectively improved without reducing efficiency and lifespan of the light source. The COB light source module can simplify the manufacture and assembly of the lighting lamps.

According to a preferred embodiment not shown in the drawings, a through hole of a gold plating (conductive material), a mechanical mounting hole and an electrical connection hole are disposed on the driving circuit board. Wherein, mechanical mounting holes are evenly distributed on the peripheral area of the driving circuit board 101 for securing the driving circuit board. The gold plating through hole is designed for mounting electrical elements on the driving circuit board 101. In order to distribute the elements neatly, evenly and reasonably on the driving circuit board, gold plating through holes are also arranged accordingly. The electrical connection hole is designed for electrically connecting an element to another element.

According to a preferred embodiment, the power supply interface of the at least one LED module 104 is exposed to outside as a convex dot. The convex dot of the power supply interface is a tin pad, for electrical connection with the driving circuit board 101 through the conductive circuit. The bump-shaped pad on the conductive circuit is electrically connected to the convex dot of the power supply interface of the at least one LED module 104 and the through-hole-shaped pad of the driving circuit board through welding wires respectively.

According to a preferred embodiment, the aluminum substrate 103 has an electrical connection through hole corresponding to the electrical connection hole of the driving circuit board 101, wherein a wire of the driving circuit board 101 passes through the electrical connection through hole to be connected to an external power source to obtain power therefrom.

According to a preferred embodiment, a double-sided high-viscosity heat conducting plate 102 is covered on a bottom of the aluminum substrate 103, and the LED light engine 100 is directly secured to another lighting device through the double-sided high-viscosity heat conducting plate 102.

According to a preferred embodiment not shown in the drawings, the light reflecting inclined surface of the protective cover 106 is an inclined surface with an orange-peel effect. The inclined surface with an orange-peel effect can reflect light evenly and produce soft spots without glaring lights, which can be widely used in LED lighting devices for daily lives.

According to a preferred embodiment not shown in the drawings, a lower edge of the internal hole has a trapezoidal cross section, wherein convex dots are evenly distributed on a lower surface of the lower edge, so that the lower surface are tightly adhered to the double-sided high-viscosity heat conducting plate 102. The lower edge of the trapezoidal cross section increases the contact area of the lower edge of the internal hole and the double-sided high-viscosity heat conducting plate 102, so that the protective cover 106 can be tightly secured on the aluminum substrate 103. In addition, the convex dots evenly distributed on the lower surface of the lower edge can further increase the contact area of the lower edge and the double-sided high-viscosity heat conducting plate 102 and make the contact area become coarse. The convex dots, due to small volume, can be embedded into the double-sided high-viscosity heat conducting plate through an external force, so that the lower edge of the internal hole can be adhered to the aluminum substrate more tightly.

Figure 7:
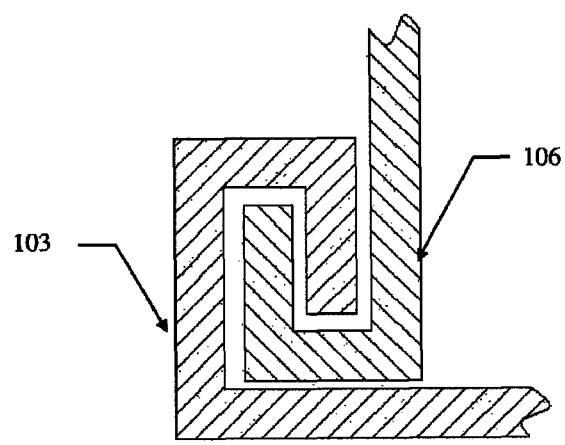
FIG. 7 is a detailed view of an ultrathin LED light engine according to the present disclosure.
Figure 8:
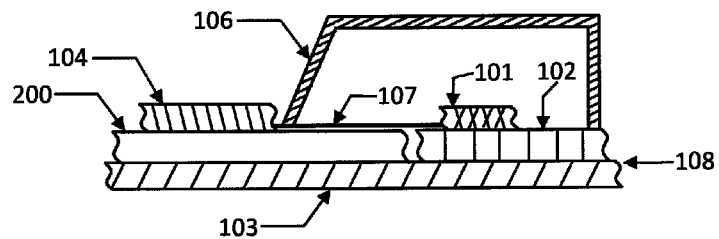
FIG. 8 is a cross sectional view of an ultrathin LED light engine according to an embodiment of the present disclosure.
Figure 9:
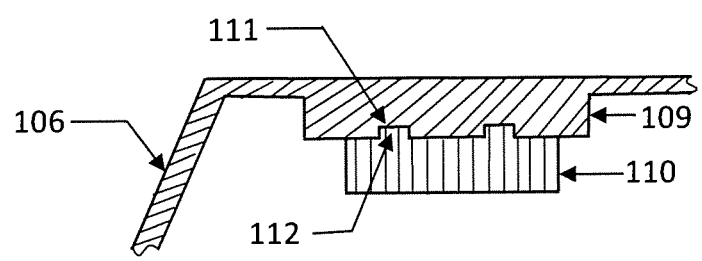
FIG. 9 is a cross sectional view of the protective cover with a fastener portion and an optical element according to an embodiment of the present disclosure.

Referring to the schematic view of FIG. 7, a downward-opened U-shaped hook element which projects upward is disposed at an outer perimeter of the aluminum substrate 103. An upward-opened U-shaped hook element matching with the downward-opened U-shaped hook element is disposed at a lower end of the outer wall of the protective cover 106, so that the downward-opened U-shaped hook element and the upward-opened U-shaped hook element are connected to each other in an embedded manner. Free ends of the downward-opened U-shaped hook element and the upward-opened U-shaped hook element can be smooth curved surfaces, so that in assembly, the protective cover 106 can be smoothly pushed into the aluminum substrate 103. Such a connection can make the protective cover 106 and the aluminum substrate 103 connected to each other more tightly, and even if the double-sided high-viscosity heat conducting plate 102 loses viscosity over time, the protective cover 106 will not come off the aluminum plate 103.

According to a preferred embodiment not shown in the drawings, the first surface of the aluminum substrate has evenly distributed convex dots, so that the double-sided high-viscosity heat conducting plate 102 can tightly cover the aluminum plate 103. The convex dots on the aluminum plate 103 not only can increase the contact area between the aluminum plate 103 and the double-sided high-viscosity heat conducting plate 102, but also can make the contact area become coarse, to increase the friction coefficient, so that the double-sided high-viscosity heat conducting plate 102 can tightly cover the aluminum plate 103.

According to a preferred embodiment, the double-sided high-viscosity heat conducting plate 102 is made of elastic material having a thickness of 0.1-0.5 mm. The elastic material not only has viscosity and thermal conductivity, but also has elasticity, so that it can be expanded and contracted depending on the temperature. In other words, the elastic double-sided high-viscosity heat conducting plate 102 can expand and contract correspondingly with a member to which the elastic double-sided high-viscosity heat conducting plate 102 is connected, when the volume of the member (such as the lower ends of the aluminum substrate 103 or the protective cover 106) changes with environmental temperature changes or temperature changes caused by LED light emitting. Thereby, the double-sided high-viscosity heat conducting plate will not generate gap between it and the member, and remain adhered to the member tightly. The double-sided high-viscosity heat conducting plate also has a thickness of 0.1-0.5 mm, so that the convex dots on the first surface of the aluminum substrate 103 can be embedded into the double-sided high-viscosity heat conducting plate 102 by external forces without penetrating the double-sided high-viscosity heat conducting plate 102. Similarly, the convex dots on the lower surface of the lower edge of the internal hole can be embedded into the double-sided high-viscosity heat conducting plate 102 without penetrating the double-sided high-viscosity heat conducting plate 102. Thus, the double-sided high-viscosity heat conducting plate having a thickness of 0.1-0.5 mm has a depth that can embed the convex dots, and also are not too thin to influence the adhesion effect. Such an elastic double-sided high-viscosity heat conducting plate can be a heat conducting silicon plate.

According to a preferred embodiment not shown in the drawings, a fracture-reserved slot is disposed at a reserved portion of the aluminum substrate 103 which goes beyond an area of the protective cover 106. The fracture-reserved slot is V-shaped. Since the LED light engine 100 has an ultrathin structure, it is difficult to hold it during mounting. The reserved portion is disposed on the LED light engine to facilitate the holding and mounting of the LED light engine, and it can be broken off along the fracture-reserved slot after the mounting so that the reserved portion is removed to achieve an aesthetic effect.

The present disclosure can solve the following technical problems:

1. since the built-in driving circuit board will generate a lot of heat, the heat dissipating problem of the driving IC requires to be solved with an excellent heat conducting means; and 2. the driving circuit board and the aluminum substrate are required to be electrically connected through a means which is heat conductive and steady, other than a fly wire, while the LED light engine according to the present disclosure is designed for an ultrathin application with built-in driving and controlling means, and can be applied in widespread fields of spotlights, down-lights and the like. The prevent invention has a reduced size and thickness, is a miniaturized product with a light weight, a small size, and a good cost performance, without requirement of a driving circuit. In particular, the LED light engine according to the present disclosure can achieve a product having an overall thickness less than 6 mm.

It should be noted that, the above specific embodiments are exemplary. Based on the above embodiments under the above teaching of the present disclosure, one skilled in the art can made various modifications and alterations falling within the protective scope of the present disclosure. It should be appreciated by those skilled in the art that the above specific description is merely for explaining the present disclosure, rather than limiting the present disclosure. The protective scope of the present disclosure is defined by the claims and the equivalent thereof.

What is claimed is:

1. An ultrathin LED light engine, comprising a protective cover; a driving circuit board; an aluminum substrate and at least one LED module,
   wherein a double-sided high-viscosity heat conducting plate covers a first surface of the aluminum substrate to secure the driving circuit board,
   wherein the at least one LED module is secured on the first surface and insulated from the aluminum substrate by means of an insulating layer on the first surface,
   wherein a conductive circuit is disposed on the insulating layer for electrically connecting the at least one LED module and the driving circuit board, and
   wherein at least an outer peripheral area of the aluminum substrate is larger than an outer peripheral area of the driving circuit board, so that the double-sided high-viscosity heat conducting plate on the first surface secures the protective cover at least at a partial area.

2. The LED light engine according to claim 1, wherein an outer peripheral area of the aluminum substrate which is covered by the double-sided high-viscosity heat conducting plate goes beyond an outer perimeter of the driving circuit board, and a lower edge of the protective cover is secured on the double-sided high-viscosity heat conducting plate at the outer peripheral area of the aluminum substrate which goes beyond the outer perimeter of the driving circuit board.

3. The LED light engine according to claim 2, wherein the driving circuit board has a shape of a plate with a central opening, wherein the at least one LED module is positioned at the central opening of the driving circuit board, and wherein a power supply interface of the at least one LED module is located within the protective cover.

4. The LED light engine according to claim 3, wherein the protective cover has a shape of a circular ring, an elliptical ring or a rectangular ring in a plan view, and wherein the protective cover has a height adapted for accommodating the driving circuit board.

5. The LED light engine according to claim 4, wherein the protective cover is provided with an internal hole, an outer wall and a light reflecting inclined surface extending from the internal hole to an outer perimeter of the protective cover, wherein size of the internal hole matches with that of at least one LED module, wherein a lower edge of the internal hole is secured on the double-sided high-viscosity heat conducting plate at a position adjacent to the at least one LED module, and wherein the lower edge of the outer wall is secured on the double-sided high-viscosity heat conducting plate at the outer peripheral area of the aluminum substrate which goes beyond the outer perimeter of the driving circuit board.

6. The LED light engine according to claim 5, wherein a slope gradient of the light reflecting inclined surface of the protective cover depends on a height of the protective cover which is at least capable of accommodating the driving circuit board.

7. The LED light engine according to claim 5, wherein the light reflecting inclined surface is an inclined surface with an orange-peel effect.

8. The LED light engine according to claim 5, wherein a lower edge of the internal hole has a trapezoidal cross section, wherein the lower surface are tightly adhered to the double-sided high-viscosity heat conducting plate.

9. The LED light engine according to claim 1, wherein the conductive circuit is a printed circuit.

10. The LED light engine according to claim 1, wherein the protective cover is provided with a fastener portion for securing an optical element.

11. The LED light engine according to claim 10, wherein the fastener portion of the protective cover is a detachable ring-shaped buckle, and wherein at least two grooves are evenly distributed on a surface of the fastener portion of the protective cover, and match with at least two corresponding flanges on the optical element to form fasteners.

12. The LED light engine according to claim 1, wherein a bump-shaped pad is disposed on the conductive circuit on the aluminum substrate, wherein a through-hole-shaped pad corresponding to the bump-shaped pad is disposed on the driving circuit board and the bump-shaped pad and the through-hole-shaped pad are electrically connected by welding.

13. The LED light engine according to claim 1, wherein a lower edge of the protective cover overlaps with a side of the aluminum substrate.

14. The LED light engine according to claim 13, wherein the LED light engine is rectangular in a plan view, and wherein (1) a first lower edge, a second lower edge and a third lower edge of the protective cover overlap with a first side, a second side and a third side of the aluminum substrate, respectively, or (2) a first lower edge and a second lower edge of the protective cover overlap with a first side and a second side of the aluminum substrate, respectively, or (3) a first lower edge of the protective cover overlaps with a first side of the aluminum substrate.

15. The LED light engine according to claim 14, wherein a size of the aluminum substrate is larger by 1% than an area occupied by the protective cover.

16. The LED light engine according to claim 1, wherein a downward-opened U-shaped hook element which projects upward is disposed at an outer perimeter of the aluminum substrate; an upward-opened U-shaped hook element matching the downward-opened U-shaped hook element is disposed at a lower end of the outer wall of the protective cover, so that the downward-opened U-shaped hook element and the upward-opened U-shaped hook element are connected to each other in an embedded manner.

17. The LED light engine according to claim 1, (1) the double-sided high-viscosity heat conducting plate tightly covers the aluminum plate or (2) the double-sided high-viscosity heat conducting plate is made of elastic material having a thickness of 0.1-0.5 mm or (3) a fracture-reserved slot is disposed at a portion of the aluminum substrate which goes beyond an area of the protective cover; and the fracture-reserved slot is V-shaped.

* * * * *